United States Patent

Hurrell

(10) Patent No.: US 9,191,023 B2
(45) Date of Patent: Nov. 17, 2015

(54) ANALOG TO DIGITAL CONVERTER AND A METHOD OF OPERATING AN ANALOG TO DIGITAL CONVERTER

(71) Applicant: ANALOG DEVICES TECHNOLOGY, Hamilton (BM)

(72) Inventor: Christopher Peter Hurrell, Berkshire (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/173,407

(22) Filed: Feb. 5, 2014

(65) Prior Publication Data

US 2015/0222288 A1     Aug. 6, 2015

(51) Int. Cl.
| | |
|---|---|
| *H03M 1/00* | (2006.01) |
| *H03M 1/44* | (2006.01) |
| *H03M 1/80* | (2006.01) |
| *H03G 3/30* | (2006.01) |
| *H03M 1/12* | (2006.01) |

(52) U.S. Cl.
CPC .............. *H03M 1/442* (2013.01); *H03M 1/002* (2013.01); *H03M 1/1295* (2013.01); *H03G 3/3052* (2013.01); *H03M 1/00* (2013.01); *H03M 1/12* (2013.01); *H03M 1/804* (2013.01)

(58) Field of Classification Search
CPC ......... H03M 1/00; H03M 1/12; H03M 1/804; H03G 3/3052
USPC .......... 341/110, 155, 156, 122, 172; 375/345
See application file for complete search history.

(56) References Cited

U.S. PATENT DOCUMENTS

| | | | |
|---|---|---|---|
| 6,653,967 B2 | 11/2003 | Hamashita | |
| 7,076,229 B2 | 7/2006 | Wang | |
| 7,924,062 B2 | 4/2011 | Chiu | |
| 7,944,386 B2 | 5/2011 | Hurrell et al. | |
| 8,542,066 B2 | 9/2013 | Kusuda | |
| 2004/0160351 A1 | 8/2004 | Rossi | |
| 2013/0182803 A1* | 7/2013 | Ishii et al. | 375/345 |

OTHER PUBLICATIONS

U.S. Appl. No. 13/624,334, filed Sep. 21, 2012.
Non-Final Office Action in U.S. Appl. No. 13/624,334 mailed on Jan. 3, 2014.
Notice of Allowance in U.S. Appl. No. 13/624,334 mailed Apr. 30, 2014.

* cited by examiner

*Primary Examiner* — Joseph Lauture
(74) *Attorney, Agent, or Firm* — Patent Capital Group

(57) ABSTRACT

Example embodiments of this disclosure can provide an apparatus, a system, and a method of correcting for charge lost from a sampling capacitor as a result of an analog to digital conversion being performed. In an embodiment, there is provided a method of operating an analog to digital converter comprising at least a first sampling capacitor used to sample an input signal, where the method can further comprise a correction step of modifying the voltage across the at least first sampling capacitor, the correction step being performed prior to commencing an acquire phase.

35 Claims, 4 Drawing Sheets

ANALOG TO DIGITAL CONVERTER AND A METHOD OF OPERATING AN ANALOG TO DIGITAL CONVERTER

CROSS-REFERENCE TO RELATED APPLICATION

This application is related to U.S. patent application Ser. No. 13/624,334, which is hereby incorporated by reference in its entirety.

TECHNICAL FIELD

This disclosure relates generally to digital converter technologies. In certain example embodiments, this disclosure offers a method, a system, and an apparatus for reducing a load presented by an analog to digital converter (ADC) and/or operating an analog to digital converter to reduce the load that it presents.

BACKGROUND

There are many types of analog to digital converter technologies such as flash, sigma-delta, successive approximation routine converters, etc. These different styles of converter may be used in combination. In some converter topologies, an input signal is sampled onto a sampling capacitor (or an array of capacitors) prior to the analog to digital conversion taking place. During the sampling operation, charge is exchanged between the sampling capacitor and a circuit driving the analog to digital converter sampling capacitor. The driving circuit may have an impedance such that it takes time to charge and discharge the sampling capacitor to its correct voltage. This time will, to some extent, depend on the voltage across the sampling capacitor resulting from a preceding sample and convert cycle. Adequate performance should be obtained when the voltage across the sampling capacitor at the beginning of the acquire operation corresponds to the previously sampled voltage and has not been perturbed by the operation of the ADC.

BRIEF DESCRIPTION OF THE DRAWINGS

Embodiments of an improved analog to digital converter will now be described, by way of non-limiting example only, with reference to the accompanying drawings, in which.

DESCRIPTION OF EXAMPLE EMBODIMENTS

Figure 1:
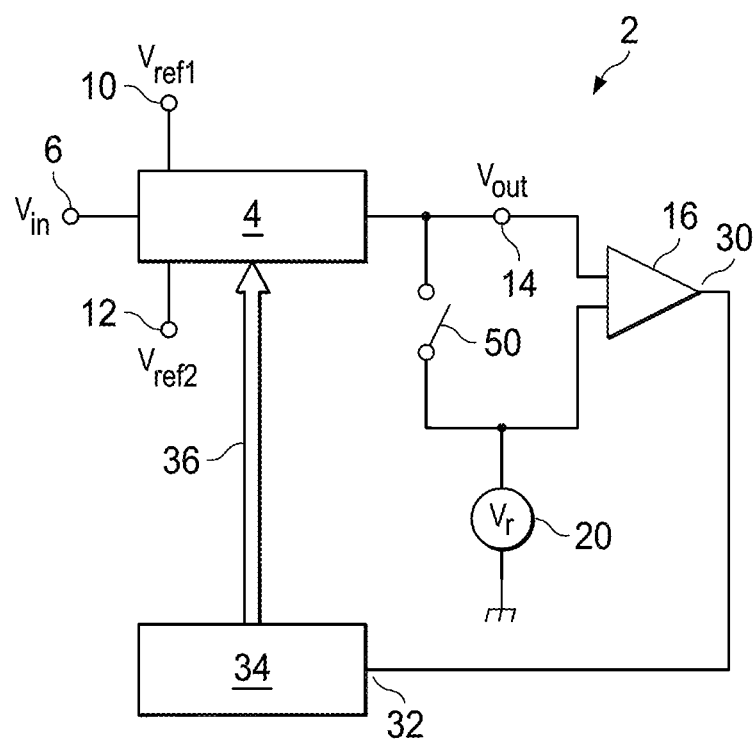
FIG. 1 is a schematic diagram of a switched capacitor array analog to digital converter.

Before turning to example embodiments of the present disclosure, it is important to understand the more common problems encountered by designers of analog to digital converters (ADCs). For simplicity, the following discussion will focus on the successive approximation converter architecture, although the present disclosure applies to any technology in which a voltage to be converted is acquired by and held on a sampling capacitor.

ADCs employing a successive approximation routine are common, where such converters may be fabricated using a switched capacitor array. The switched capacitor array can function both as an input voltage sampling capacitor and as a charge redistribution digital to analog converter, thereby enabling the switched capacitor array to be involved in both sampling an input signal, and then generating a digital representation of it by selective switching of the capacitors between first and second reference voltages. Certain systems can provide redundancy to such switched capacitor arrays by the inclusion of additional capacitors (which may be called "redundancy capacitors") used in additional bit trials in order to give the array the potential to recover from an incorrect decision during a bit trial. Such incorrect decisions may occur when an analog equivalent of the digital value being tested as part of the conversion routine is very close to the sampled signal value. Errors may occur due to noise on supply rails of a comparator making the comparison, or as a result of the circuit not having settled completely. In some embodiments of analog to digital converters having redundancy, the additional (redundant) bits are not used to sample the input voltage but instead are used to sample a DC voltage available within the ADC. Whilst the use of such redundant bits is advantageous in producing a more accurate converter, and/or allowing conversion times to be shortened because of the ability to recover from an incorrect bit trial decision, they also have the potential to allow some charge to be lost from the sampling capacitor, such as the switched capacitor array during the conversion process. This can manifest itself as the analog to digital converter needing to draw additional current from the signal that it is sampling, even when the signal is a DC signal, or only changing very slowly. This would not be the case with a switched capacitor array analog to digital converter, which did not have redundancy because in such a converter, the voltage across the capacitors of the array at the end of a conversion, when they are reconnected in parallel in preparation for a subsequent signal acquisition, should be equal to the preceding acquired signal. This is because no charge has been lost from the array. Thus, the voltage across the array should return to the previous sample value.

Signals may be passed through a low pass filter (LPF) connected to a signal input of the analog to digital converter to limit the noise power sampled by such a converter. Loss of charge from the sampling capacitors to, for example, any redundancy capacitors that get selected during an analog to digital conversion may adversely impact on the accuracy of a subsequent conversion due to the need to supply or sink current via the low pass filter to the sampling capacitor or array of such capacitors in order to charge it to the correct sample voltage.

Although it is less obvious, charge loss to redundant capacitors also affects the accuracy and performance of the converter when converting AC signals as the sampling capacitor needs to charge at each sample instance, and the voltage difference it needs to charge by from one sample to the next will depend to some extent on whether charge was lost to the redundancy capacitors. The speed at which the sampling capacitor can settle to the correct value is limited by the low pass filter used to reduce noise power.

Overview

According to a first aspect of this disclosure, there is provided a method of operating an analog to digital converter, the converter comprising at least a first sampling capacitor used during sampling of an input signal. The method further comprises a correction step of modifying the voltage across the at least first sampling capacitor, the correction step being performed prior to commencing an acquire phase.

Advantageously, in a particular embodiment, a plurality of capacitors may be provided in a first capacitor array. The first capacitor array may be used as part of a successive approximation analog to digital converter. One or more of the capacitors of the first array may be used as sampling capacitors to sample the input signal.

The correction step can correct for changes in charge on the sampling capacitor, or an array of capacitors used to sample the input signal. Changes in charge may occur for many reasons. One reason is the provision of redundancy capacitors to help the converter recover from an incorrect bit trial decision. Another may be due to charge injection from operating the transistor switches within an ADC. Furthermore some circuit features that are provided to linearize the response of an ADC may cause charge to be lost (in a controlled manner) from the sampling capacitor or the array of capacitors used to sample the input signal. Such an arrangement may be the formation of two sampling paths of different capacitance and/or resistance such that a difference in sampled values allows an error value to be calculated and corrected. Such an arrangement is described in U.S. Ser. No. 13/624,334 filed on 21 Sep. 2012 and incorporated herein by reference. These additional circuits will be referred to as an "enhancement circuit."

Where one or more redundancy capacitors are provided, the correction step may comprise returning the one or more redundancy capacitors to an initial state. The initial state can correspond to the connection state of the capacitors during the most recent sampling/acquire event.

By returning the redundancy capacitor or capacitors to an initial state, it is thereby possible to return some of the charge to the capacitors involved in sampling the input signal. This reduces any charge transfer between the analog to digital converter and the circuit driving it as a result of one or more of the redundancy capacitors being selected during an analog to digital conversion. The correction step is performed after a conversion result has been obtained. Where the sampling capacitors were members of a switched capacitor array that has been used as a digital to analog converter as part of the analog to digital conversion, the capacitors are left in the connection state that they achieved to produce the conversion result whilst the correction step is being performed. The converter can then move to an acquire phase for its next analog to digital conversion.

The switched capacitor array of a successive approximation ADC may be regarded as being divided into first and second arrays, where the redundancy capacitors are only found in the second array. The second array may be constituted entirely of redundancy capacitors. The first array includes a plurality of capacitors, each capacitor having a first capacitor node and a second capacitor node. The first capacitor node of each capacitor is associated with respective switches. The switches for each capacitor are operable to connect the first node of the capacitor to a first reference voltage $V_{ref1}$, or to a second reference voltage $V_{ref2}$. This is done in a "break before make" manner by the switches. It therefore follows that the switches are advantageously operable to place each first node of the capacitors of the first array in a high impedance state where the first node is not connected to anything else. Some of the capacitors of the first capacitor array, and optionally all of them, are connectable to an input node so as to sample or acquire an input signal during the acquire phase. The second capacitor node of each capacitor in the first array may be connected to a first shared node. The first shared node may advantageously be connected to a reference voltage during the acquire phase, such that each of the capacitors involved during sampling get charged to a voltage $V_c$, where $V_c = V_{in} - V_r$, where $V_r$ represents a reference voltage and $V_{in}$ is the voltage at the input node. $V_r$ may, for example, be $V_{ref2}$ where $V_{ref2}$ represents a ground voltage, or it may be a common mode voltage, such as a midpoint between $V_{ref1}$ and $V_{ref2}$.

Advantageously, in certain embodiments, prior to entering the acquire phase, the voltage at the first shared node may be modified by a correction circuit so as to vary the voltage across the or each sampling capacitor, which may be each one or some of the capacitors of the first array. This modification may be done based on the knowledge of which, if any, redundancy capacitors were selected during the conversion, such as a SAR conversion process. Based on knowledge of which capacitors were selected, and knowledge of the total capacitance of the first array, a controller may estimate how much charge has been transferred between the first array and the or each redundancy capacitor. Based on this, a correction voltage can be estimated so as to return that charge to the capacitors of the first array. This may be done whilst the first nodes of the capacitors are connected to $V_{ref1}$ or $V_{ref2}$ as appropriate depending on the result of the analog to digital conversion that has just been finished.

Once the capacitors involved in sampling the input voltage $V_{in}$ have been charged, the switches may be operated to place the first nodes of the capacitors of the first array in an isolated state. The correction voltage may then be removed from the first shared node. The switches associated with the first nodes of the capacitors of the first array may then be operated to connect the capacitors in parallel with one another such that charge redistribution occurs. As a result, the voltage across the switched capacitor array should equal the previously sampled input voltage, as would have been the case if no redundancy capacitors had been selected for inclusion in the analog to digital converter result. Thus, the load presented by the switched capacitor array when it is reconnected to the signal to be converted is minimized, and hence the converter response may be made more linear.

The correction voltage may be provided by a correction digital to analog converter driven in response to the value of the or each redundancy capacitor that was selected. In an alternative arrangement, each redundancy capacitor may be fabricated with a companion capacitor. The size of the companion capacitor may be varied, based on knowledge of the nominal values of the first and second reference voltages, such that the capacitor can become charged by those reference voltages, and when the companion capacitor is connected between the first shared node and one or other of the first and second reference voltages $V_{ref1}$ and $V_{ref2}$ it either supplies, or removes, an appropriate amount of charge to compensate for charge transfer that had occurred between the capacitors of the first array and the redundancy capacitors.

In certain embodiments, the controller may also be arranged to compensate for other sources of charge leakage (or charge injection) that affect the sampling capacitors. This may be in place of or in addition to compensating for the selection of any redundancy capacitors.

According to a second aspect of this disclosure there is provided a method of operating a switched capacitor array analog to digital converter having redundancy capacitors, wherein prior to entering an acquire phase, the redundancy capacitors are placed in an initial state. According to a further aspect of this disclosure there is provided an analog to digital converter comprising at least a first sampling capacitor arranged to be used to sample an input signal during an acquire mode, the analog to digital converter further comprising correction circuitry for modifying a voltage across the at least first sampling capacitor prior to entering the acquire mode. The at least first sampling capacitor may be a capacitor of a first array of capacitors that are used as a digital to analog converter during a successive approximation analog to digital conversion.

The analog to digital converter may include means, such as redundancy capacitors, for improving the accuracy of a conversion or improving converter speed or other performance parameters. The modification may be based on an estimate of charge transferred from the or each sampling capacitor, to the redundancy capacitors (or to parasitic capacitors) selected during an analog to digital conversion immediately preceding the modification step.

According to a further aspect of this disclosure there is provided an analog to digital converter comprising a switched capacitor array having at least one redundancy capacitor therein, wherein a controller of the analog to digital converter is arranged, after an analog to digital conversion has been completed, to return the circuit connections of the at least one redundancy capacitor to an initial state prior to entering an acquire mode.

The initial state may be such that all of the redundancy capacitors are connected at their first nodes to one of the reference voltages, for example $V_{ref2}$ where $V_{ref2}$ represents a ground voltage. Alternatively, the capacitors may be connected to a further reference voltage such as $V_r$ or selected ones of them may be connected to $V_{ref1}$ and other selected capacitors may be connected to $V_{ref2}$ to provide both positive and negative redundancy.

A single switched capacitor array may be used with a single ended analog to digital converter. Two switched capacitor arrays may be used with a differential analog to digital converter. The use of a differential converter provides enhanced ability to recover from errors made at critical decisions, where either a bit that should have been kept has been discarded, or a bit that should have been discarded has been kept.

Example Embodiments

FIG. 1 schematically illustrates an example of a successive approximation analog to digital converter, generally indicated 2, which comprises a switched capacitor array 4 having an input node 6 to which a voltage $V_{in}$ may be applied for conversion. The switched capacitor array 4 also has a first reference terminal 10 for accepting a first reference voltage of $V_{ref1}$, and a second reference terminal 12 for accepting a second reference voltage $V_{ref2}$. The switched capacitor array has an output 14 from which it outputs a voltage to a first input of a comparator 16. A second input of the comparator 16 receives a voltage $V_r$ that may, for example, correspond to a mid-point in the analog to digital converter's nominal conversion range. The reference voltage $V_r$ may be provided by a reference voltage generator 20. An output 30 of the comparator 16 is provided to first input 32 of a successive approximation routine controller 34. Such successive approximation routine controllers may be implemented as state machines. The controller 34 has an output bus 36 for controlling various switches within the switched capacitor array 4.

Figure 2:
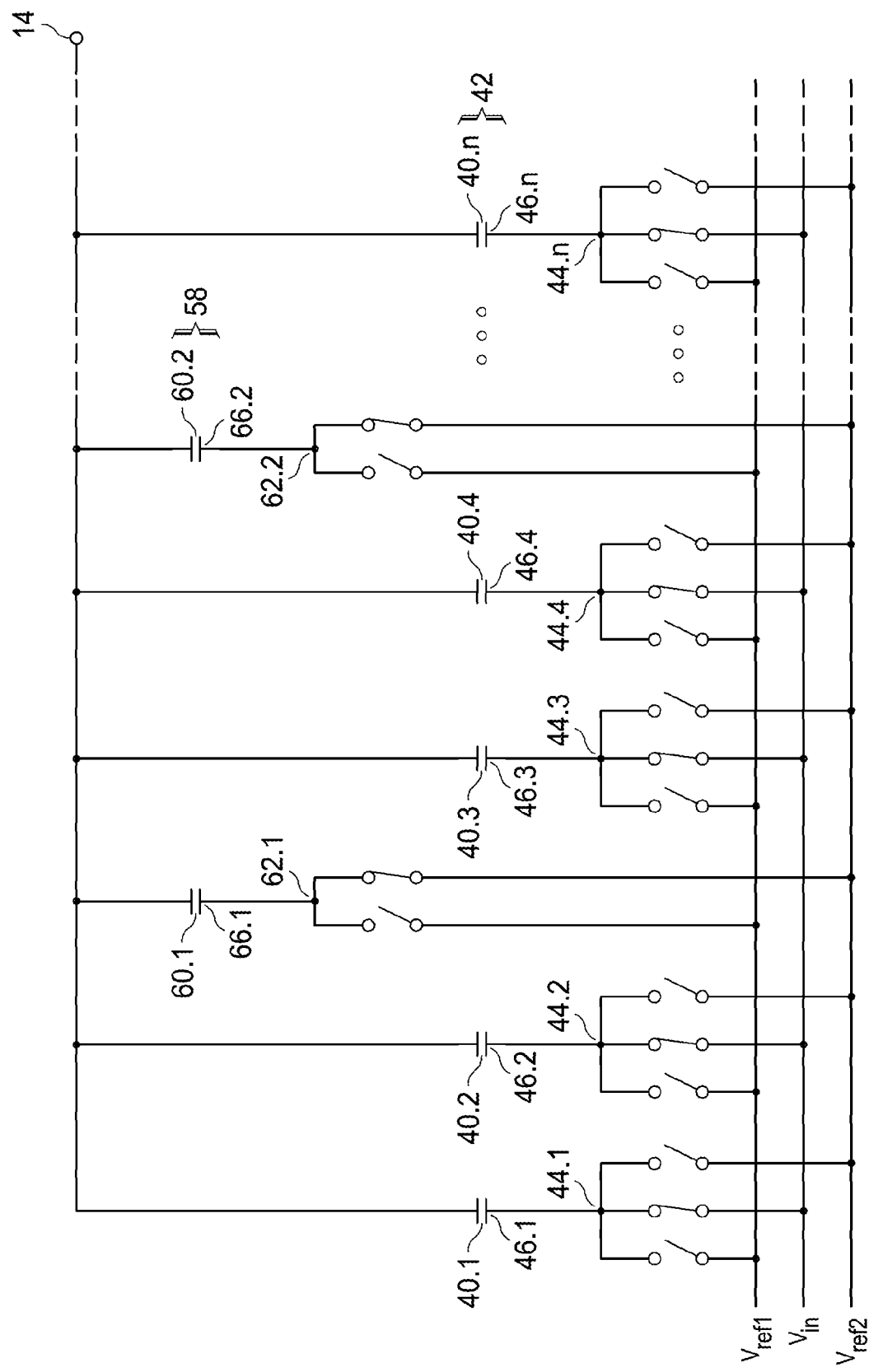
FIG. 2 illustrates an example of a circuit diagram of a switched capacitor array including redundancy capacitors.

An example of a switched capacitor array is shown in more detail in FIG. 2. The array comprises a plurality of sample capacitors 40.1, 40.2, 40.3 to 40.n arranged in a first array, generally indicated 42. The sample capacitors 40.1 to 40.n are notionally binary weighted. If the array is provided as a single segment (segmented arrays being a typical implementation), then each (P+1)th capacitor typically has half the capacitance of a Pth capacitor, where P is an integer between 1 and n−1, inclusive. Some systems provide segmented arrays in which first and second segments are coupled by a coupling capacitor. Certain embodiments of the present disclosure describe systems for returning the voltage across the sampling capacitor to the previous sample voltage before commencing a subsequent sampling or acquisition phase.

The use of segmented arrays still allows a binary, or other, progression in relative contribution to the output word to be achieved between the first to nth capacitors 40.1 to 40.n, but the segmentation allows the physical capacitor sizes to be rescaled thereby avoiding having to make the less significant capacitors impractically small. Each of the sample capacitors of the first array is associated with a transistor switch 44.1 to 44.n. Each switch may, as shown, in fact be formed of three individual switches, preferably implemented as field effect transistors such that a first node 46.1 of the first capacitor 40.1 can be selectively connected by the transistor switch 44.1 to either $V_{ref1}$, $V_{in}$ or $V_{ref2}$ or be disconnected from all three of these voltages for break before make operation. Similar considerations apply to each of the other switches illustrated in this example. In the arrangement shown in FIG. 2, the switches are illustrated in an "acquire" phase such that the first nodes of the capacitors of the first array 42 are connected to $V_{in}$. The second nodes of the capacitors are connected to a shared node, which in the illustrated example is the output node 14.

Referring briefly back to FIG. 1, it can be seen that a sampling switch 50 is provided between the output 14 of the switched capacitor array 4, and the reference voltage generator 20. The input voltage $V_{in}$ is only sampled onto the capacitors 40.1 to 40.n when the switches 44.1 to 44.n are in the acquire position as shown in FIG. 2 (closed to connect the first nodes of the capacitors to $V_{in}$) and when the sampling switch 50 is closed. The sampling switch 50 may be used to operate the switched capacitor array in either a "sample and hold" or "track and hold" manner. The capacitors 40.1 to 40.n of the first array will charge or discharge as the input voltage $V_{in}$ changes until such time as the switch 50 is opened. At this point each of the capacitors 40.1 to 40.n is charged to a voltage $V_c = V_{in} - V_r$.

In one example implementation of a switch capacitor array, one without redundancy, only the first array 42 of capacitors (FIG. 2) would be provided. As noted before, these are typically binary scaled such that capacitor 40.2 has half the value of capacitor 40.1. Similarly, capacitor 40.3 has half the value of capacitor 40.2 and so on. This scaling is repeated (subject to segmentation being applied) to obtain an analog to digital converter of the desired resolution. Typically, SAR converters may have between 4 and 18-bit resolution. These values are presented by way of discussion only and are not limiting.

For ease of explanation, it will be assumed that there are only five capacitors available in the first array. Thus in this example we can define that capacitor 40.5 has an arbitrary value of 1c. Capacitor 40.4 has a value of 2c, capacitor 40.3 has a value of 4c, capacitor 40.2 has a value of 8c and capacitor 40.1 has a value of 16c.

In use, once the input signal $V_{in}$ had been acquired, the successive approximation routine controller would start by placing all the switches to connect the first nodes 46.1 to 46.5 of the capacitors 40.1 to 40.5 to $V_{ref2}$. The SAR routine then proceeds by operating switch 44.1 to connect the first capacitor 40.1 to $V_{ref1}$. This causes charge distribution to occur within the array of capacitors resulting in a variation of voltage at the output node 14. This voltage at the output 14 is compared with $V_r$ by the comparator 16. Generally speaking, if the output voltage at the node 14 is less than $V_r$, then a signal to the controller 34 causes the switch position for the first capacitor 40.1 to be retained. If the value of the output 14 is greater than $V_r$, then the switch position is discarded, by reconnecting the first node of the first capacitor 40.1 back to $V_{ref2}$. This marks the end of the first bit trial. Next, the controller 34 initiates a second bit trial by connecting the first node 46.2 of the second capacitor 40.2 to $V_{ref1}$. This causes further charge redistribution and again the voltage at the node 14 is compared with $V_r$, and either the switch position is marked to be kept or is discarded. This process continues all the way down to the final bit trial for the capacitor 40.5, when a five bit output word, as indicated by which of the respective switches are kept connected to $V_{ref1}$, represents the converted digital representation of the analog value.

At any bit trial, voltage $V_{out}$ at the output node 14 may be very close to $V_r$. This represents a "critical decision." There is no way of knowing in advance which bit trial will represent the critical decision. However, any perturbation of the converter may result in the bit being incorrectly kept or incorrectly discarded. If this occurs, the subsequent bit trials will seek to reduce the error, but there will always be a residual error in the output word. This can be troublesome where, for example, a bit is discarded when it should have been kept.

In order to reduce the impact of incorrect bit trials, certain systems can provide an array of redundant bits within the switched capacitor array. This array of redundancy bits can be regarded as a second array, generally indicated 58 in FIG. 2. In the example shown, the redundant bits are implemented by redundancy capacitors 60.1 and 60.2. These redundancy capacitors, with a total capacitance of $C_{red}$, are associated with switches 62.1 and 62.2 that are operable such that a first node 66.1 of the first redundancy capacitor 60.1 may either be disconnected from the circuit, connected to $V_{ref1}$, or connected to $V_{ref2}$. Similarly, a first node 66.2 of the second redundancy capacitor 60.2 can either be held in a high impedance state, or connected by switch 62.2 to either $V_{ref1}$ or $V_{ref2}$. The redundancy capacitors may repeat the weights of one or more of the bit trials. In this example, the first redundancy capacitor 60.1 may be provided to repeat the bit weight of the second capacitor 40.2 and the second redundancy capacitor 60.2 may be provided to repeat the bit weight of the fourth capacitor 40.4. Thus if any of the more significant bits are incorrectly discarded when they should have been accepted, there is sufficient additional "weight" in the array to make up for the deficit. The redundancy capacitors are tested as if they were part of the normal array 42, but the output word from the SAR controller has to be modified to take account of these extra capacitors. Therefore, in the arrangement shown in FIG. 2 having redundancy capacitors, the first bit test involves the first capacitor 40.1. The second bit test involves the capacitor 40.2, the third bit test involves the capacitor 60.1. The fourth bit test involves the capacitor 40.3, the fifth bit test involves the capacitor 40.4, the sixth bit test involves the capacitor 60.2 and the seventh bit test involves the capacitor 40.5. The output is still mapped to be a five-bit word by the controller 34.

If the redundancy capacitors are not kept in a SAR conversion, then the voltage across these capacitors is the same at the end of the conversion as at the beginning and so no net charge has been exchanged between the redundancy capacitors and the sampling capacitors of the first array, it is as if the redundancy capacitors were never part of the circuit. So when the sampling capacitors are reconnected in parallel in preparation for sampling a subsequent signal, the combined charges should redistribute such that the voltage at the first node sampling of each sampling capacitor is substantially $V_{in}$ as previously sampled. Consequently, when the next sample is taken, very little current should be taken from or supplied to the circuit driving the input node 6. This is advantageous, as taking current from the circuit being monitored by the analog to digital converter may perturb that circuit. However, if a redundancy bit is selected, then some charge transfer occurs between the corresponding redundancy capacitor and the first array comprising the capacitors 40.1 to 40.5.

Figure 3:
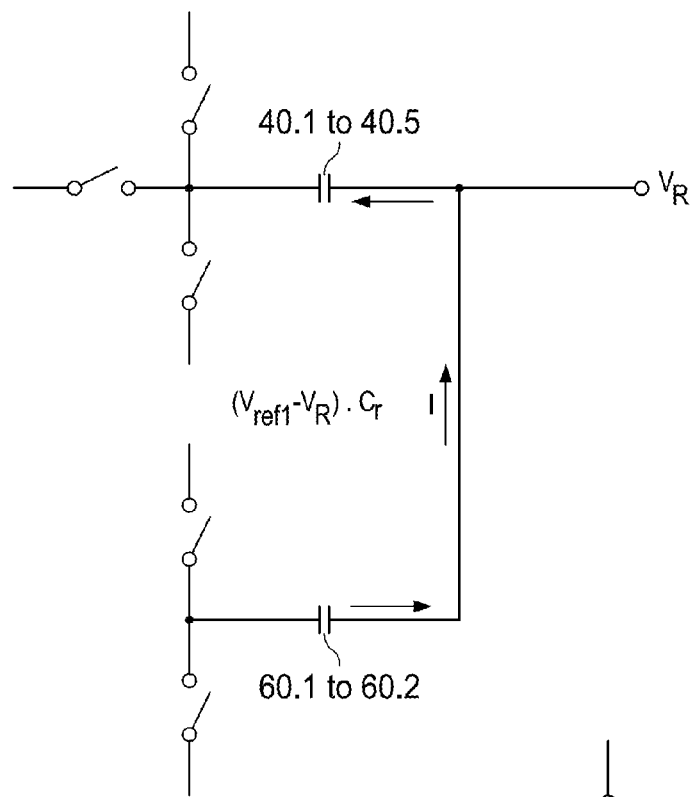
FIG. 3 illustrates an example of the array of FIG. 2 in schematic form, with the array divided into a primary array represented by a single capacitor, and a redundancy array represented by another single capacitor, and further schematically illustrating charge transfer as a result of selecting a redundancy capacitor during a successive approximation register (SAR) bit trial.

Referring to FIG. 3, the array of FIG. 2 is represented schematically, with all of the capacitors 40.1 to 40.5 being represented by the uppermost capacitor and redundancy capacitors being represented by the lowermost capacitor. It can be seen that if, for example, the second redundancy capacitor 60.2 having a weight of 2 is kept, then a charge of $V_{ref} \times 2C$ flows from the redundancy capacitor to the main array, where $V_{ref}$ is the difference between $V_{ref1}$ and $V_{ref2}$. In fact, if the total weight of the redundancy capacitors selected during the conversion is represented by the capacitance $C_r$, then a charge of $V_{ref} \cdot C_r$ is transferred to the sample capacitors of the first array. In general, this should not be a large amount, but it can still perturb operation of the analog to digital converter at the next sample. The charge injected in to the sampling capacitors causes a voltage error, $V_{error1}$, across the sampling capacitors when they are connected back in parallel, which is represented as $$V_{error1} = V_{ref} \frac{C_r}{C_s}$$

where $C_s$ equals the total capacitance of the sample capacitors of the first array (C40.1 to C40.n).

The inventor realized that this charge error on the main array could be addressed by two approaches. A first approach, and one which is conceptually simple, is to return the switches related to the redundancy array 58 back to an initial condition, which corresponds to the position they were in at the time the input signal was sampled while keeping the sampling switch 50 open (high impedance). Thus, referring back to FIG. 2, where the switches 44.1-44.n are in the acquire state, the redundancy switches are operated to connect the first nodes 66.1 and 66.2 of the redundancy capacitors to a selected one of the voltage references, for example $V_{ref2}$. In some arrangements, the initial state may have some of the redundancy capacitors connected to $V_{ref1}$ and some of them connected to $V_{ref2}$ or all of the redundancy capacitors connected to $V_{ref1}$.

By making sure the redundancy capacitors are returned to this state for a period of time whilst the other switches are still set to the configuration that they achieved at the end of the successive approximation routine, most of the charge lost to the redundancy capacitors 60.1 to 60.2 is returned to the capacitors of the main array 42. This may well be a sufficient solution on its own.

As noted above, most but not all of the charge actually returns to the main array. The voltage at node 14 will be close to the value of $V_r$ during this condition, but is not quite at that voltage. In fact, the node 14 will tend towards the voltage $V_{out'}$ where $$V_{out'} = \frac{V_{ref} \cdot C_r}{C_{tot}} + V_r$$

where $C_r$ equals the capacitance of the redundancy capacitors, which were kept during the conversion and so, contributed to the output word and $C_{tot}$ represents the total capacitance of the first array comprising the capacitors 40.1 to 40.$n$, plus the value of the redundancy capacitors 60.1, 60.2, and any parasitic capacitance $C_p$ on the output node 14.

From this, it follows that there is a voltage error, $V_{error2}$, across the sampling capacitors, represented as $$V_{error2} = \frac{V_{ref} \cdot C_r \cdot (C_{red} + C_p)}{C_{tot} \cdot C_s} = V_{error1} \cdot \frac{C_{red} + C_p}{C_s}$$

caused by the unwanted charge on the redundancy and parasitic capacitors, lost from the sampling capacitors. Thus, the uncorrected voltage error $V_{error1}$ is reduced by a factor $(C_{red}+C_p)/C_s$. Since both the total capacitance of the redundancy capacitors $C_{red}$ and the parasitic capacitance $C_p$ are typically much smaller than $C_s$, the corrected voltage error $V_{error2}$ will typically be much less than $V_{error1}$.

Figure 4:
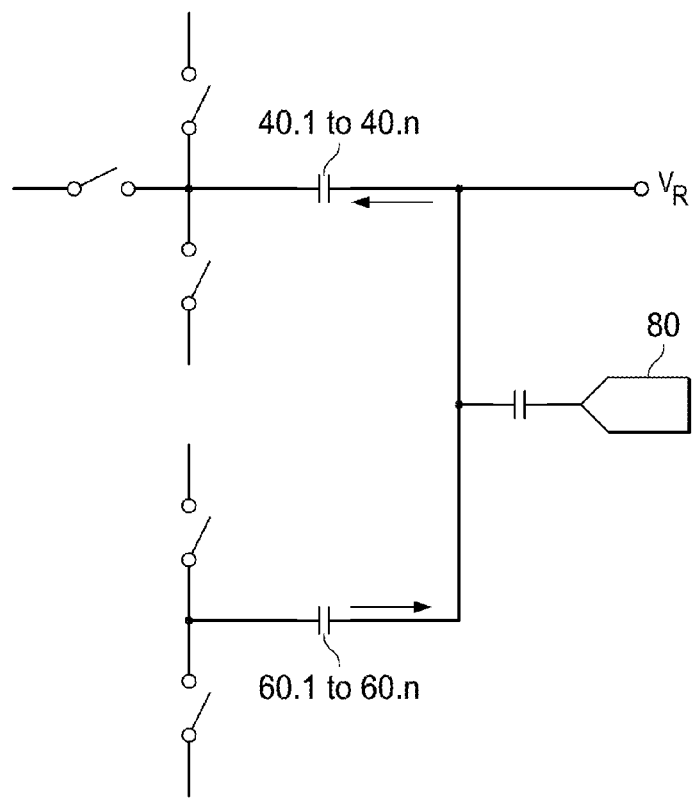
FIG. 4 schematically illustrates an example of a switchable capacitor array in association with a correction digital to analog converter (DAC)

Since $V_{error1}$ and $V_{error2}$ can both be calculated from knowledge of which redundant capacitors have been kept and the DAC capacitances it is then possible to perturb or further perturb the voltages across the capacitors of the first array 42 prior to making the sampling capacitor switches 44.1 to 44.$n$ high impedance in preparation for entering the next acquire phase, to further reduce the error in the sampling capacitors. A way of doing this, and one that does not need to involve modifying the switch arrangement shown in FIG. 2, is to apply a voltage at the output node 14, so that charge can flow from the output node 14 through the capacitors to $V_{ref1}$ and $V_{ref2}$ thereby changing the amount of charge stored on each sampling capacitor. One way of achieving this is to provide a correction DAC 80, as shown in FIG. 4, which is responsive to an indication from the SAR controller 34 to generate a perturbing voltage to modify the charge across each of the capacitors. The switches 44.1 to 44.$n$ may then be operated to place them in a high impedance state so the corrected charge becomes trapped on the capacitors of the first capacitor array. The DAC 80 may then be disconnected from the node 14. This may be achieved by placing the DAC in the high impedance state or placing the first nodes of the sampling capacitors in a high impedance (disconnected) state. Thus, when the switches 44.1 to 44.$n$ are operated to connect the first plates of the capacitors to $V_{in}$, and the sampling switch 50 is closed, there is now a reduced charge error or no charge error to be supplied from the input node 6.

The DAC 80 may be operated instead of switching the redundancy capacitors back to their initial state or in conjunction with switching some or all of the redundancy capacitor to either their initial state or to a state determined by the controller. The DAC may couple to the output node capacitively. However, Ohmic/galvanic coupling, for example by the use of a switch, may also be used. Other switching schemes will also be possible if, for example, one or more of the first plates of the capacitors can be connected to a DAC by further switches. Thus, the input state of the capacitor array may be modified to allow a correction voltage to be delivered.

Figure 5:
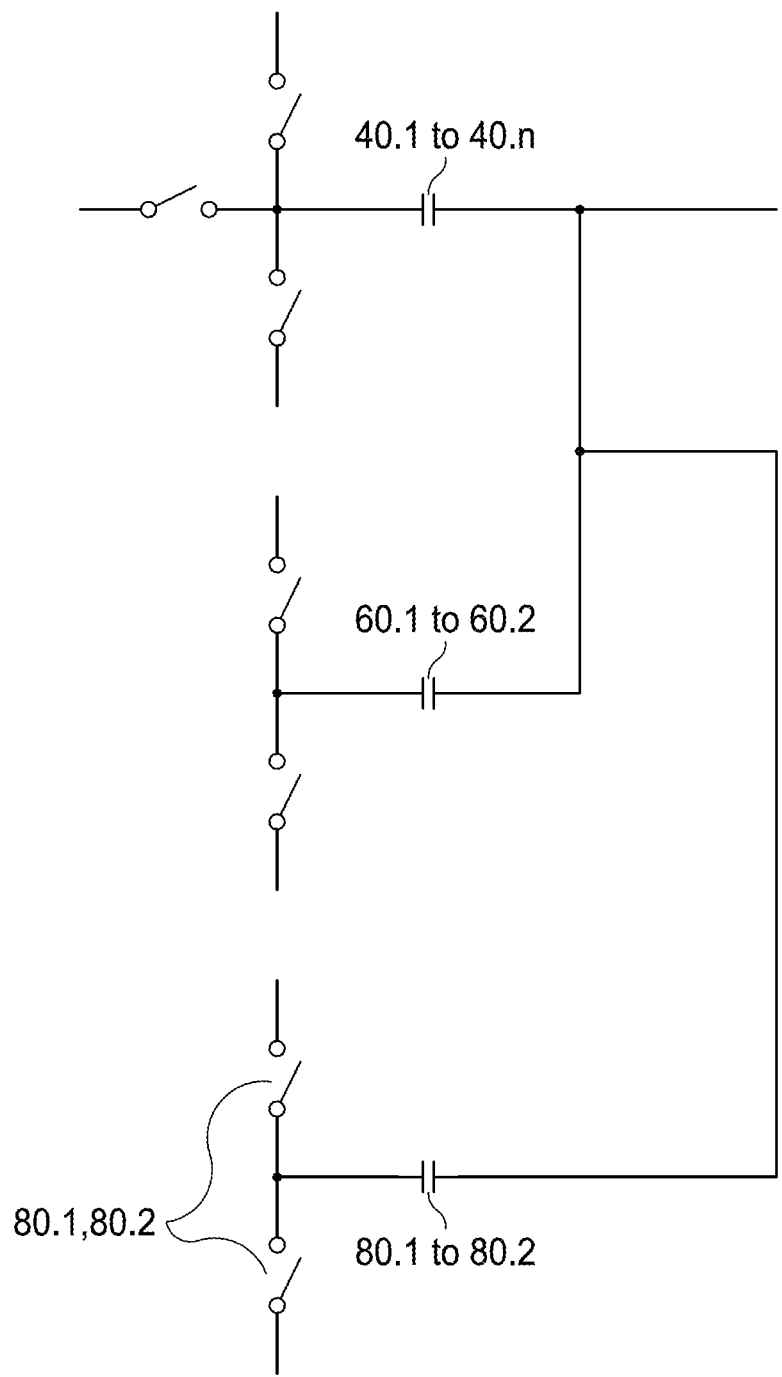
FIG. 5 schematically illustrates an example of a switched capacitor array where redundancy capacitors are associated with companion capacitors.

In an alternative arrangement, as shown in FIG. 5, an array of companion capacitors can be fabricated in association with the redundancy capacitors. These companion capacitors can be regarded as working together to form a DAC. In the simple example shown in FIGS. 2 and 3 where there are only two redundancy capacitors 60.1 and 60.2, there would only need to be two companion capacitors 80.1 and 80.2. Each of these is scaled in relation to its associated redundancy capacitor such that, when it is selectively connected to $V_{ref1}$ or $V_{ref2}$ it transfers an opposing and compensating amount of charge to that which was lost or gained by the corresponding redundancy capacitor being selected in the successive approximation routine conversion. The companion capacitors 80.1 and 80.2 have their own associated switches 82.1, 82.2 similar to the switches 62.1 and 62.2 the companion capacitors can also be charged during the acquisition phase. However, unlike the redundancy capacitors, once the SAR conversion routine is commenced the companion capacitors are not tested. Typically, the switches 82.1 and 82.2 are operated to hold one plate of the companion capacitors at a fixed voltage during the bit trials. This switch 80.1 may be open during the bit trials and switch 82.2 may be closed. If a redundancy capacitor associated with given one of the companion capacitors is selected during a bit trial, then the switches 82.1 and 82.2 may be switched so as to connect the associated companion capacitor to a different one of the reference voltages during the period in which the switches of the redundancy capacitors are operated to reconnect the redundancy capacitors to an initial state. Thus, the switches for the compensation capacitors are switched as appropriate in order to make up the charge error.

It will be appreciated that the step of returning the switches of the redundancy capacitors to an initial state could be omitted all together if the companion capacitors are suitably sized (made bigger) in order to return all the missing charge merely by virtue of their operation alone.

Although for simplicity of explanation the teachings of this disclosure have been made in respect of a small non-segmented array in a single ended SAR analog to digital converter, the teachings can be applied to segmented arrays and to differential analog to digital converters. The teachings can also be applied to other converter technologies where charge may be lost from a sampling capacitor or to other error sources such as those due to charge injection of switches, or to where additional "enhancement circuits" have been provided to compensate for sources of non-linearity such as changes in switch resistances as a function of $V_{in}$.

It is thus possible to provide an improved analog to digital converter and a method of operating such a converter. The converter may be provided within an integrated circuit and may find utility in audio, video, industrial processes or indeed any other process where a voltage needs to be monitored and digitized.

In the discussions of the embodiments above, the capacitors, arrays, switches, transistors, inductors, resistors, amplifiers, nodes, converters, digital core, controllers, and/or other components can readily be replaced, substituted, or otherwise modified in order to accommodate particular circuitry needs. Moreover, it should be noted that the use of complementary electronic chips, hardware, software, etc. offer an equally viable option for implementing the teachings of the present disclosure.

In one example embodiment, any number of electrical circuits of the FIGURES may be implemented on a board of an associated electronic chip. The board can be a general circuit board that can hold various components of the internal electronic system of the electronic chip and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and other peripheral chips may be attached to the board as plug-in cards, via cables, or integrated into the board itself.

In another example embodiment, the electrical circuits of the FIGURES may be implemented as stand-alone modules (e.g., a chip with associated components and circuitry configured to perform a specific application or function) or implemented as plug-in modules into application specific hardware of electronic chips. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities as described herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of components, logic operations, equations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that rely on synchronization signals to execute specialized software programs, or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can apply the functionalities described herein in high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the electrical circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media chip). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, ADCs, arrays, logic gates, software, hardware, links, etc.) that can be part of any type of electronic device (e.g., computer), which can further include a circuit board coupled to a plurality of electronic components. The system can include means for sampling an input signal, which may also include means for providing a correction step of modifying the voltage across the at least first sampling capacitor, the correction step being performed prior to commencing an acquire phase.

The system can also include means for using a correction digital to analog converter to modify the voltage across the first sampling capacitor based on the previous conversion. The system can be such that the capacitors of the first array each have a first capacitor node and a second capacitor node, where the first capacitor nodes are associated with respective switches such that the first capacitor nodes are connected to an input node during the acquire phase, and controllably to one of a first reference voltage and a second reference voltage during a conversion, and the second capacitor nodes are connected together at a first shared node, and the step of modifying the voltage across the capacitors comprises modifying the voltage at the first shared node while leaving one or more of the first nodes connected to either of the first or second reference voltages as determined during the conversion.

The system can also include means for using a correction digital to analog converter to modify the voltage at the first shared node in response to a signal indicating the state of one or more of the capacitors of the first array in the previous conversion. The system can also include means for using a correction digital to analog converter to modify the voltage at the first shared node in response to a signal indicating the state of one or more of the redundancy capacitors in the previous conversion.

In certain cases, prior to entering the acquire phase, one or more of the redundancy capacitors are placed in an initial state while a sampling switch is conducting. The system can also include means for placing the redundancy capacitors in an initial state comprises selectively connecting the first node of each redundancy capacitor to a predetermined reference voltage.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

The claims presented herein have been presented in single dependency format for filing at the USPTO. However, it should be understood that each and every claim could be dependent on any claim of the same category, except where that is clearly not feasible.

The invention claimed is:

1. A method of operating an analog to digital converter, the analog to digital converter comprising at least one sampling capacitor used to sample an input signal in acquire phases, wherein the method comprises applying a correction step for returning a voltage across the at least one sampling capacitor to a sample voltage acquired during sampling of a first acquire phase prior to commencing a second acquire phase, the first and second acquire phases being consecutive acquire phases.

2. The method as claimed in claim 1, further comprising using a correction digital to analog converter to return the voltage across the at least one sampling capacitor based on the previous conversion.

3. The method as claimed in claim 1, wherein the at least sampling capacitor is a capacitor in a first array of capacitors.

4. The method as claimed in claim 3, wherein the capacitors of the first array each have a first capacitor node and a second capacitor node, where the first capacitor nodes are associated with respective switches such that the first capacitor nodes are connected to an input node during the acquire phases, and controllably to one of a first reference voltage and a second reference voltage during a conversion, and wherein the second capacitor nodes are connected together at a first shared node, and wherein the correction step comprises modifying the voltage at the first shared node while leaving one or more of the first nodes connected to either of the first or second reference voltages as determined during the conversion.

5. The method as claimed in claim 4, further comprising using a correction digital to analog converter to modify the voltage at the first shared node in response to a signal indicating the state of one or more of the capacitors of the first array in the previous conversion.

6. The method as claimed in claim 3, wherein the correction step is performed after a conversion result has been achieved, and the capacitors of the first array are in the configuration they reached as the conversion result was achieved.

7. The method as claimed in claim 1, wherein the correction step for returning the voltage across the at least one sampling capacitor to the sample voltage acquired during sampling of the first acquire phase comprises adjusting a voltage at a shared node of the at least one sampling capacitor.

8. The method as claimed in claim 7, wherein the at least one sampling capacitor comprises a first capacitor node and a second capacitor node, where the first capacitor node is associated with a switch such that the at least one capacitor is connected to the input signal during the acquire phases, and wherein the shared node of the at least one sampling capacitor is the second capacitor node.

9. The method as claimed in claim 1, wherein:
the at least one sampling capacitor is used to sample the input signal in the acquire phases when a sampling switch is closed,
the analog to digital converter further comprises at least one redundancy capacitor, the at least one redundancy capacitor not used to sample the input signal, and
the correction step comprises placing the at least one redundancy capacitor, prior to commencing the second acquire phase, in an initial state while the sampling switch is open.

10. The method as claimed in claim 9, wherein the at least one redundancy capacitor is placed in the initial state while the at least one sampling capacitor is connected to a reference voltage to which the at least one sampling capacitor was connected at the end of a conversion phase associated with the first acquire phase.

11. The method as claimed in claim 9, wherein the correction step is long enough to allow redistribution of charge between the at least one sampling capacitor and the at least one redundancy capacitor.

12. An analog to digital converter, comprising a switched capacitor array configured to sample an input signal in acquire phases and further comprising correction circuitry configured to modify a voltage across the switched capacitor array to a sample voltage acquired during sampling of a first acquire phase prior to commencing a second acquire phase, the first and second acquire phases being consecutive acquire phases, said modifying being a function of charge lost from the switched capacitor array during an immediately preceding analog to digital conversion.

13. The analog to digital converter as in claim 12, wherein the modifying voltage is a function of the state of the capacitors in the preceding conversion.

14. The analog to digital converter as claimed in claim 12, wherein the correction circuitry comprises a digital to analog converter.

15. The analog to digital converter as claimed in claim 12, wherein the switched capacitor array is part of a first array of capacitors used in a successive approximation analog to digital conversion.

16. The analog to digital converter as claimed in claim 15, further comprising a plurality of redundancy capacitors, wherein the redundancy capacitors are capacitors that are not used to sample the input signal sampled by sampling capacitors of the switched capacitor array in the acquire phases.

17. The analog to digital converter as claimed in claim 16, wherein the correction circuitry comprises a plurality of companion capacitors associated with the redundancy capacitors and scaled with respect to the redundancy capacitors such that, when selected for connection to the sampling capacitors, the plurality of companion capacitors correct for charge transferred to the redundancy capacitors.

18. An analog to digital converter comprising:
a switched capacitor array configured to sample an input signal during an acquire mode and configured to be used in a successive approximation analog to digital conversion;
a plurality of redundancy capacitors; and
correction circuitry configured to modify a voltage across the switched capacitor array prior to entering the acquire mode, said modifying being a function of charge lost from the switched capacitor array during an immediately preceding analog to digital conversion,
wherein the correction circuitry comprises a plurality of capacitors associated with the redundancy capacitors and scaled with respect to the redundancy capacitors such that, when selected for connection to the sampling capacitors, the plurality of capacitors are configured to correct for charge transferred to the redundancy capacitors.

19. An analog to digital converter comprising at least one sampling capacitor configured to sample an input signal in acquire phases, the analog to digital converter configured to apply a correction step for returning a voltage across the at least one sampling capacitor to a sample voltage acquired during sampling of a first acquire phase prior to commencing a second acquire phase, the first and second acquire phases being consecutive acquire phases.

20. The analog to digital converter as claimed in claim 19, further comprising a correction digital to analog converter configured to return the voltage across the at least one sampling capacitor based on the previous conversion.

21. The analog to digital converter as claimed in claim 19, further comprising a first array of capacitors, wherein:
the at least sampling capacitor is a capacitor in the first array of capacitors,
the capacitors of the first array each have a first capacitor node and a second capacitor node, where the first capacitor nodes are associated with respective switches such that the first capacitor nodes are configured to be connected to an input node during the acquire phases, and controllably to one of a first reference voltage and a second reference voltage during a conversion,
the second capacitor nodes are connected together at a first shared node, and
the correction step comprises modifying the voltage at the first shared node while leaving one or more of the first nodes connected to either of the first or second reference voltages as determined during the conversion.

22. The analog to digital converter as claimed in claim 21, further comprising a correction digital to analog converter configured to modify the voltage at the first shared node in response to a signal indicating the state of one or more of the capacitors of the first array in the previous conversion.

23. The analog to digital converter as claimed in claim 21, further comprising one or more of redundancy capacitors and a correction digital to analog converter configured to modify the voltage at the first shared node in response to a signal indicating the state of the one or more of redundancy capacitors in the previous conversion.

24. The analog to digital converter as claimed in claim 19, wherein the analog to digital converter is configured to initiate the application of the correction step when the at least one sampling capacitor is in a configuration that occurred at the end of the most recent analog to digital conversion.

25. The analog to digital converter as claimed in claim 19, further comprising an enhancement circuit.

26. The analog to digital converter as claimed in claim 19, further comprising at least one redundancy capacitor, wherein:
the at least one sampling capacitor is configured to sample the input signal in the acquire phases when a sampling switch is closed,
the at least one redundancy capacitor is configured to not be used to sample the input signal, and
the correction step comprises placing the at least one redundancy capacitor, prior to commencing the second acquire phase, in an initial state while the sampling switch is open.

27. The analog to digital converter as claimed in claim 26, wherein the initial state of the at least one redundancy capacitor comprises the at least one redundancy capacitor being connected to a reference voltage to which the at least one redundancy capacitor was connected during the first acquire phase.

28. The analog to digital converter as claimed in claim 19, further comprising at least a first redundancy capacitor, the first redundancy capacitor not used to sample the input signal, and wherein the correction step comprises placing the first redundancy capacitor, prior to commencing the second acquire phase, in an initial state by selectively connecting a first node of the first redundancy capacitor to a predetermined reference voltage.

29. The analog to digital converter as claimed in claim 28, wherein the first redundancy capacitor is a capacitor in a plurality of redundancy capacitors, wherein the predetermined reference voltage comprises at least one of a first reference voltage and a second reference voltage, and first nodes of the plurality of redundancy capacitors are configured to be returned to respective ones of the first and second reference voltages.

30. The analog to digital converter as claimed in claim 19, further comprising at least a first redundancy capacitor and a companion capacitor associated with the first redundancy capacitor,
wherein the companion capacitor comprises a first node and a second node, the first node configured to be connected to a first predetermined reference voltage or a second predetermined reference voltage, and the second node configured to be connected to a node shared with the at least one sampling capacitor, and
wherein the first node of the companion capacitors is configured to remain connected to a fixed voltage comprising either the first predetermined reference voltage or the second predetermined voltage during the successive approximation routine conversion and is configured to be selectively connected to either the first predetermined reference voltage or the second predetermined reference voltage so as to modify the charge on the first sampling capacitor prior to the second acquire phase being commenced.

31. The analog to digital converter as claimed in claim 19, wherein the at least first sampling capacitor is a capacitor in a first array of capacitors, the analog to digital converter further comprises one or more redundancy capacitors and companion capacitors associated with respective ones of the one or more redundancy capacitors, and wherein the companion capacitors are configured to be selectively connected to a first predetermined reference voltage or a second predetermined reference voltage while coupled to a first shared node of the first array of capacitors to correct the charge on the capacitors of the first array.

32. An analog to digital converter, comprising a switched capacitor array having a plurality of redundancy capacitors, wherein a controller of the analog to digital converter is arranged, after an analog to digital conversion has been completed, to return circuit connections of the redundancy capacitors to an initial state prior to entering an acquire mode and wherein the redundancy capacitors are capacitors that are not used to sample an input signal sampled by sampling capacitors of the switched capacitor array during the acquire mode.

33. The analog to digital converter as claimed in claim 32, further comprising means for modifying a voltage at a shared node to which the capacitors of the analog to digital are connected so as to modify a charge on those ones of the capacitors that are connected to an input node during the acquire mode.

34. The analog to digital converter as claimed in claim 33, wherein the means for modifying the voltage at the shared node comprise a correction digital to analog converter.

35. The analog to digital converter as claimed in claim 33, wherein the means for modifying the voltage at the shared node comprises a plurality of companion capacitors selectively connectable between a first predetermined reference voltage and a second predetermined reference voltage.

* * * * *